United States Patent
Yamaguchi et al.

(10) Patent No.: US 6,569,534 B2
(45) Date of Patent: May 27, 2003

(54) OPTICAL MATERIAL AND OPTICAL ELEMENT USING THE SAME

(75) Inventors: Kenji Yamaguchi, Omiya (JP); Kazuki Mizushima, Omiya (JP)

(73) Assignee: Mitsubishi Materials Corporation, Tokyo (JP)

(*) Notice: Subject to any disclaimer, the term of this patent is extended or adjusted under 35 U.S.C. 154(b) by 129 days.

(21) Appl. No.: 09/797,881

(22) Filed: Mar. 5, 2001

(65) Prior Publication Data

US 2001/0032982 A1 Oct. 25, 2001

(30) Foreign Application Priority Data

| Mar. 24, 2000 | (JP) | 2000-083519 |
| May 29, 2000 | (JP) | 2000-158135 |
| Aug. 21, 2000 | (JP) | 2000-249281 |

(51) Int. Cl.⁷ .............. B32B 7/00; B32B 3/10; G02B 1/02; H01L 31/00; H01L 33/00; H05B 33/12

(52) U.S. Cl. .............. 428/446; 428/328; 428/690; 428/917; 313/502; 313/503; 257/80; 257/102; 257/103; 427/255.18; 427/497; 427/509; 427/526; 427/527; 427/530; 117/9; 117/104; 117/105; 117/108; 204/192.1; 136/261; 359/350

(58) Field of Search ............... 428/690, 917, 428/446, 450, 328; 313/502, 503; 257/80, 102, 103; 136/261; 359/350; 427/255.18, 509, 523, 526, 527, 530, 497; 204/192.1; 117/9, 104, 105, 108

(56) References Cited

U.S. PATENT DOCUMENTS 6,288,415 B1 * 9/2001 Leong et al. ............... 257/94

OTHER PUBLICATIONS

D. Leong et al., "A silicon/iron–disilicide light–emitting diode operating at a wavelength of 1.5 μm", Nature, vol. 387, pp. 686–688 (Jun. 12, 1997).*

K. P. Homewood et al., "Ion beam synthesized silicides: growth, characterization and devices", Thin Solid Films, vol. 381, pp. 188–193 (Jan. 15, 2001).*

* cited by examiner

Primary Examiner—Marie Yamnitzky
(74) Attorney, Agent, or Firm—Oblon, Spivak, McClelland, Maier & Neustadt, P.C.

(57) ABSTRACT

An optical material including a crystalline silicon and $Fe_xSi_2$ in the form of dots, islands, or a film is provided. The $Fe_xSi_2$ has a symmetrical monoclinic crystalline structure belonging to the $P2_1/c$ space group and is synthesized at the surface or in the interior of the crystalline silicon. The monoclinic structure corresponds to a deformed structure of $\beta$-$FeSi_2$ generated by heteroepitaxial stress between the {110} plane of the $Fe_xSi_2$ and the {111} plane of the crystalline silicon. The value of x is $0.85 \leq x \leq 1.1$. An optical element using the optical material is also provided.

14 Claims, 9 Drawing Sheets

β-FeSi$_2$ UNIT CELL
(a = 9.86Å, b = 7.79Å, c = 7.83Å)

● Fe
○ Si

US 6,569,534 B2

OPTICAL MATERIAL AND OPTICAL ELEMENT USING THE SAME

BACKGROUND OF THE INVENTION

1. Field of the Invention

The present invention relates to an iron silicide optical material which is used for optical interconnections for optical communications, optical sensors, and solar cells. The present invention also relates to an optical element using the optical material.

2. Description of the Related Art

There is growing demand for light-emitting elements and photo-receiving elements using material based on silicon so that these elements can be incorporated in a silicon substrate to be used in an optical sensor and for optical interconnections. A compound semiconductor such as, for example, gallium arsenide may be used as the material for the optical elements on the silicon substrate. However, it is difficult to incorporate such a compound semiconductor in the silicon substrate without causing defects in the structure of the compound semiconductor, and the resulting compound semiconductor exhibits poor thermal stability. Moreover, manufacturing of the compound semiconductor requires specific steps in addition to the conventional steps for manufacturing silicon integrated circuits, resulting in increased manufacturing costs. Accordingly, a technique for making silicon-based light-emitting and photo-receiving structures, which requires the conventional silicon-IC production process only, has been desired.

Conventionally, among the optical elements manufactured by the conventional technique, a light-emitting element containing iron silicide, operating at a suitable wavelength for silica glass optical fibers, which is approximately 1.5 $\mu$m, is known as a current-injection element (D. Leong, M. Harry, K. J. Reesen, and K. P. Homewood, "NATURE" Vol. 387, Jun. 12, 1997, pp. 686–688). This light-emitting element is fabricated by depositing an n-type silicon layer and a p-type silicon layer on a (100) oriented n-type silicon substrate by an epitaxial growth method, implanting iron ions in the p-type silicon layer in the vicinity of the p-n junction interface on the substrate, and annealing so as to form a monocrystalline layer of beta iron silicide ($\beta$-FeSi$_2$) having an orthorhombic structure.

However, the above-described optical element containing iron silicide has an external quantum efficiency of approximately 0.1%, which is low and causes a problem. Moreover, the optical element emits a sufficient amount of light at a cryogenic temperature but not at room temperature. Several other studies made in regard to the light-emission characteristics of $\beta$-FeSi$_2$ show that the optical element exhibits a long luminescence decay time, i.e., approximately several ten of microseconds. Optical interconnections and optical communications require much shorter luminescent decay time.

In view of the above, the present inventors have proposed a luminescent substance in which semiconductor particles of $\beta$-FeSi$_2$, having a particle diameter on the order of nanometers, are dispersed in p-type or n-type amorphous silicon or p-type or n-type amorphous silicon carbide (Japanese Unexamined Patent Application Publication No. 11-340499). Since the $\beta$-FeSi$_2$ semiconductor particles having the particle diameter on the order of nanometers are crystallized and are dispersed in the amorphous silicon or in the amorphous silicon carbide having a large bandgap, injected carriers are confined inside the semiconductor particles, thereby enhancing the light-emission efficiency compared to the conventional monocrystalline $\beta$-FeSi$_2$.

Among conventional photo-detectors, a variety of solar-cell elements, such as a single crystal silicon type, a poly-crystalline silicon type, an amorphous silicon (a-Si) type, and a gallium arsenide (GaAs) type are available on the market. However, these solar-cell elements have problems with regard to their cost and conversion efficiency, and a photo-receiving material having higher efficiency at low cost is desired. The $\beta$-FeSi$_2$ has a significantly large optical absorption coefficient at a wide wavelength range for sunlight, and can be manufactured as an ultra thin film. Thus, when the $\beta$-FeSi$_2$ is used as a photo-detector of a solar cell, the amount of raw material used can be reduced and the costs can be decreased.

The luminescent substance disclosed in the above-described Japanese Unexamined Patent Application Publication No. 11-340499 can still be improved from the point of view of light-emission efficiency and the efficiency of the manufacturing method.

Moreover, because $\beta$-FeSi$_2$ has a carrier mobility which is too small for use as a material for the photo-receiving material of solar cells, $\beta$-FeSi$_2$ is yet to be applied to solar cells.

SUMMARY OF THE INVENTION

Accordingly, it is an object of the present invention to provide a silicon-based optical material capable of achieving high light-emission efficiency and high photo-receiving efficiency.

Another object of the present invention is to provide an optical material which is capable of achieving a luminescent decay time of several tens of nanoseconds or less and which can be applied to high-speed optical communications.

Still another object of the present invention is to provide an optical material which emits and receives light at room temperature.

Yet another object of the present invention is to provide an optical element using the above-described optical material.

To these ends, the present invention provides an optical material according to an aspect of the invention comprising a crystalline silicon and Fe$_x$Si$_2$ in the form of dots, islands, or a film. The Fe$_x$Si$_2$ has a symmetrical monoclinic crystalline structure belonging to the P2$_1$/c space group and is synthesized at the surface or in the interior of the crystalline silicon. The monoclinic structure corresponds to a deformed structure of $\beta$-FeSi$_2$ generated by heteroepitaxial stress between the {110} plane of the Fe$_x$Si$_2$ and the {111} plane of the crystalline silicon, wherein the value of x is $0.85 \leq x \leq 1.1$.

Because the $\beta$-FeSi$_2$ is artificially deformed and the crystalline structure thereof is changed from an orthorhombic crystal to a monoclinic crystal, the $\beta$-FeSi$_2$ becomes less symmetrical. Thus, dipole transitions are allowed between many electronic states, and the oscillator strength which determines characteristics of the light-emitting/photo-receiving material is larger than that of the $\beta$-FeSi$_2$.

Preferably, the lattice constant of the c axis of the Fe$_x$Si$_2$ having the monoclinic crystalline structure is 7.68±0.20 Å, which is equal to the interatomic distance of the {111} plane of the crystalline silicon, the lattice constant of the a axis of the Fe$_x$Si$_2$ is 10.17±0.35 Å, the lattice constant of the b axis of the Fe$_x$Si$_2$ is 7.75±0.35 Å, and the angle defined by the a axis and the b axis of the Fe$_x$Si$_2$ is 95±3°. This crystalline structure is hereinafter referred to as "$\beta$'-I".

Preferably, the thickness of the $Fe_xSi_2$ having the monoclinic crystalline structure is 5 to 2,000 Å. In this manner, the $Fe_xSi_2$ can maintain the monoclinic crystalline structure. This crystalline structure is hereinafter referred to as "β'-I".

The optical material may further comprise β-$FeSi_2$ having an orthorhombic crystalline structure. The total thickness of the $Fe_xSi_2$ and the β-$FeSi_2$ is preferably 200 to 10,000 Å.

In this manner, the thickness of the layer can be increased compared to the optical material comprising $Fe_xSi_2$ only and the optical material can be easily manufactured. Also, because of the monoclinic crystals, light-emitting intensity and photo-receiving efficiency can be improved compared to the optical material using only β-$FeSi_2$. When the thickness exceeds 10,000 Å, all the crystals will change to β-$FeSi_2$.

Another aspect of the present invention provides an optical element comprising one of a light-emitting layer and a photo-receiving layer comprising the above-described $Fe_xSi_2$. The crystalline silicon is of p-type or n-type.

In this manner, the optical element having high light-emitting/photo-receiving efficiency and a shorter luminescent decay time can be obtained.

Still another aspect of the present invention provides an optical material comprising a crystalline silicon and $Fe_xSi_2$ in the form of dots, islands, or a film, in which the $Fe_xSi_2$ has a symmetrical monoclinic crystalline structure belonging to the C2/c space group and is synthesized at the surface or in the interior of the crystalline silicon. The monoclinic structure corresponds to a deformed structure of β-$FeSi_2$ generated by heteroepitaxial stress between the {101} plane of the $Fe_xSi_2$ and the {111} plane of a crystalline silicon, wherein x is $0.85 \leq x \leq 1.1$.

Because the β-$FeSi_2$ is artificially deformed and the crystalline structure thereof is changed from an orthorhombic crystal to a monoclinic crystal, the β-$FeSi_2$ becomes less symmetrical. Thus, dipole transition is allowed between electronic states, and oscillator strength which indicates characteristics of light-emitting/photo-receiving material is larger than that of the β-$FeSi_2$.

Preferably, the lattice constant of the b axis of the $Fe_xSi_2$ having a monoclinic crystalline structure is 7.68±0.20 Å, which is equal to the interatomic distance of the {111} plane of the crystalline silicon, the lattice constant of the a axis of the $Fe_xSi_2$ is 10.14±0.35 Å, the lattice constant of the c axis of the $Fe_xSi_2$ is 7.76±0.35 Å, and the angle formed by the a axis and the c axis of the $Fe_xSi_2$ is 95±3°. This crystalline structure is hereinafter referred to as "β'-II".

Preferably, the thickness of the $Fe_xSi_2$ having the monoclinic crystalline structure is 5 to 2,000 Å.

In this manner, the $Fe_xSi_2$ can maintain the monoclinic crystalline structure.

The optical material may further include β-$FeSi_2$ having an orthorhombic crystalline structure. The total thickness of the $Fe_xSi_2$ and the β-$FeSi_2$ is preferably 200 to 10,000 Å.

In this manner, the thickness of the layer can be increased compared to the optical material comprising $Fe_xSi_2$ only and the optical material can be easily manufactured. Also, because of the monoclinic crystals, light-emitting intensity and photo-receiving efficiency can be improved compared to the optical material using only β-$FeSi_2$. When the thickness exceeds 10,000 Å, all the crystals will change to β-$FeSi_2$.

Yet another aspect of the present invention provides an optical element comprising one of a light-emitting layer and a photo-receiving layer comprising the above-described $Fe_xSi_2$. The crystalline silicon is one of p-type and n-type.

By using the optical material of the present invention, the optical element having high light-emitting/photo-receiving efficiency and a shorter luminescent decay time.

The optical material of the present invention having such a crystalline structure has the following advantages.

First, since the material constituting the light-emitting/photo-receiving active layer is monoclinic $Fe_xSi_2$ which is less symmetrical than the orthorhombic β-$FeSi_2$, dipole transitions are allowed between many electronic states, and the oscillator strength which determines characteristics of the light-emitting/photo-receiving material is larger than that of the β-$FeSi_2$.

Second, the optical material operates at a wavelength of 1.5 μm which corresponds to the low-loss wavelength of optical fibers.

Third, since the luminescent decay time is several ten nanoseconds or less and is shorter than that of the conventional iron silicide material, the optical material can be applied to high-speed communications.

Fourth, since a layer of the optical material can be deposited on the {111} surface of the crystalline silicon, a light-emitting/photo-receiving active layer can be manufactured at reduced costs.

Fifth, because the monoclinic $Fe_xSi_2$ can be made by an epitaxial growth method, defect density at the interface between the silicon and the $Fe_xSi_2$ is reduced and the resulting optical material is suitable for an current injection element.

Sixth, the optical material is capable of emitting or receiving the light in infrared region of approximately 1.5 μm at room temperature.

Finally, because carrier mobility is enhanced compared to the conventional iron silicide material, rapid and efficient response is possible when light is received.

It should be noted here that, in this specification, the {111} plane, the {110} plane, and the {101} plane are the generic names which include the followings.

{111} is a generic name of (111), ($\bar{1}$11), (1$\bar{1}$1), (11$\bar{1}$), ($\bar{1}$$\bar{1}$1), (1$\bar{1}$$\bar{1}$), and ($\bar{1}$1$\bar{1}$), ($\bar{1}$$\bar{1}$$\bar{1}$).

{110} is a generic name of (110), ($\bar{1}$10), (1$\bar{1}$0), ($\bar{1}$$\bar{1}$0).

{101} is a generic name of (101), ($\bar{1}$01), (10$\bar{1}$) and ($\bar{1}$0$\bar{1}$).

DESCRIPTION OF THE PREFERRED EMBODIMENTS

An optical material of the present invention is Fe$_x$Si$_2$ having a monoclinic crystalline structure corresponding to a deformed structure of $\beta$-FeSi$_2$ generated by the heteroepitaxial stress between the $\beta$-FeSi$_2$ and the {111} plane of crystalline silicon at the interface or in the interior of the crystalline silicon. The Fe$_x$Si$_2$ is synthesized in the form of dots, islands, or a layer. The thickness of the Fe$_x$Si$_2$ is preferably 5 to 2,000 Å. When the thickness is less than 5 Å, Fe$_x$Si$_2$ changes to a cubic crystal which is the crystalline structure of $\gamma$-FeSi$_2$, and when the thickness exceeds 2,000 Å, $\beta$-FeSi$_2$ is no longer bound by the interatomic distance of silicon having the {111} crystal plane and changes to an orthorhombic structure which is the original crystal structure of the $\beta$-FeSi$_2$. When the thickness exceeds 200 Å, the Fe$_x$Si$_2$ partially having a monoclinic structure is sometimes formed. The optical material of the present invention includes such Fe$_x$Si$_2$ having a monoclinic crystal structure and $\beta$-FeSi$_2$ having an orthorhombic crystal structure. The crystalline silicon of the present invention may be single crystal or polycrystalline. The range of x in the Fe$_x$Si$_2$ of the present invention is $0.85 \leq x \leq 1.1$.

Now, a first embodiment of the present invention will be described.

Figure 12:
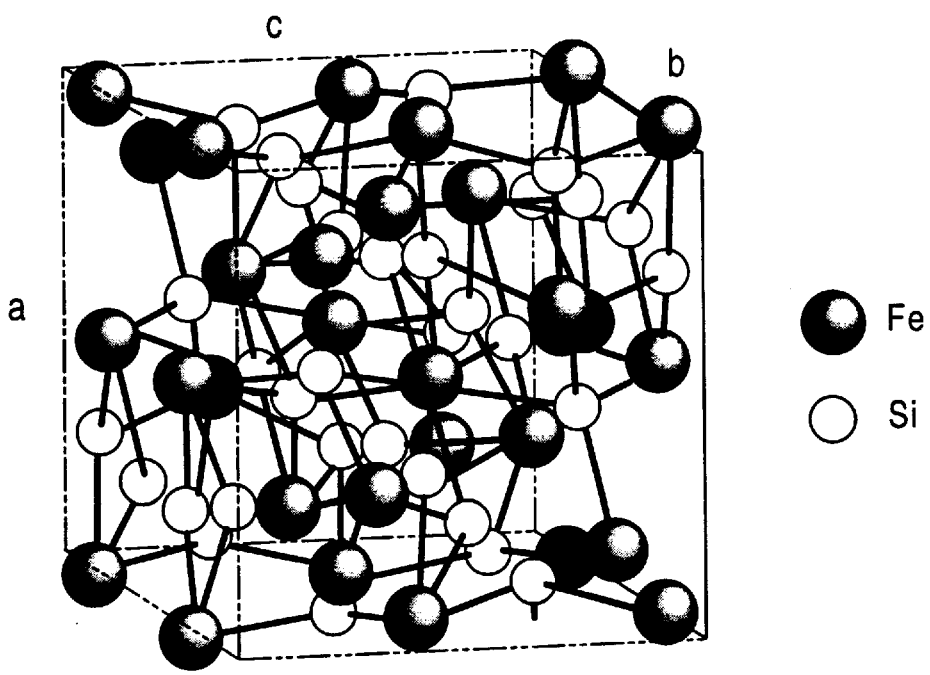
FIG. 12 shows a unit cell of crystal structure of $\beta$-FeSi$_2$.

As shown in FIG. 12, $\beta$-FeSi$_2$ has an orthorhombic crystal structure and belongs to the Cmca space group. In this specification, the lattice constants of $\beta$-FeSi$_2$ are as follows: a axis=9.86 Å, b axis=7.79 Å, and c axis=7.83 Å. When $\beta$-FeSi$_2$ is synthesized on the {111} plane of a crystalline silicon at the surface or in the interior of the crystalline silicon, the lattice constant of the c axis, i.e., 7.83 Å, is affected by the interatomic distance 7.68 Å of the {111} crystal plane of the silicon. Thus, the crystal of $\beta$-FeSi$_2$ is deformed and the $\beta$-FeSi$_2$, originally orthorhombic, changes to a monoclinic crystal.

Figure 1:
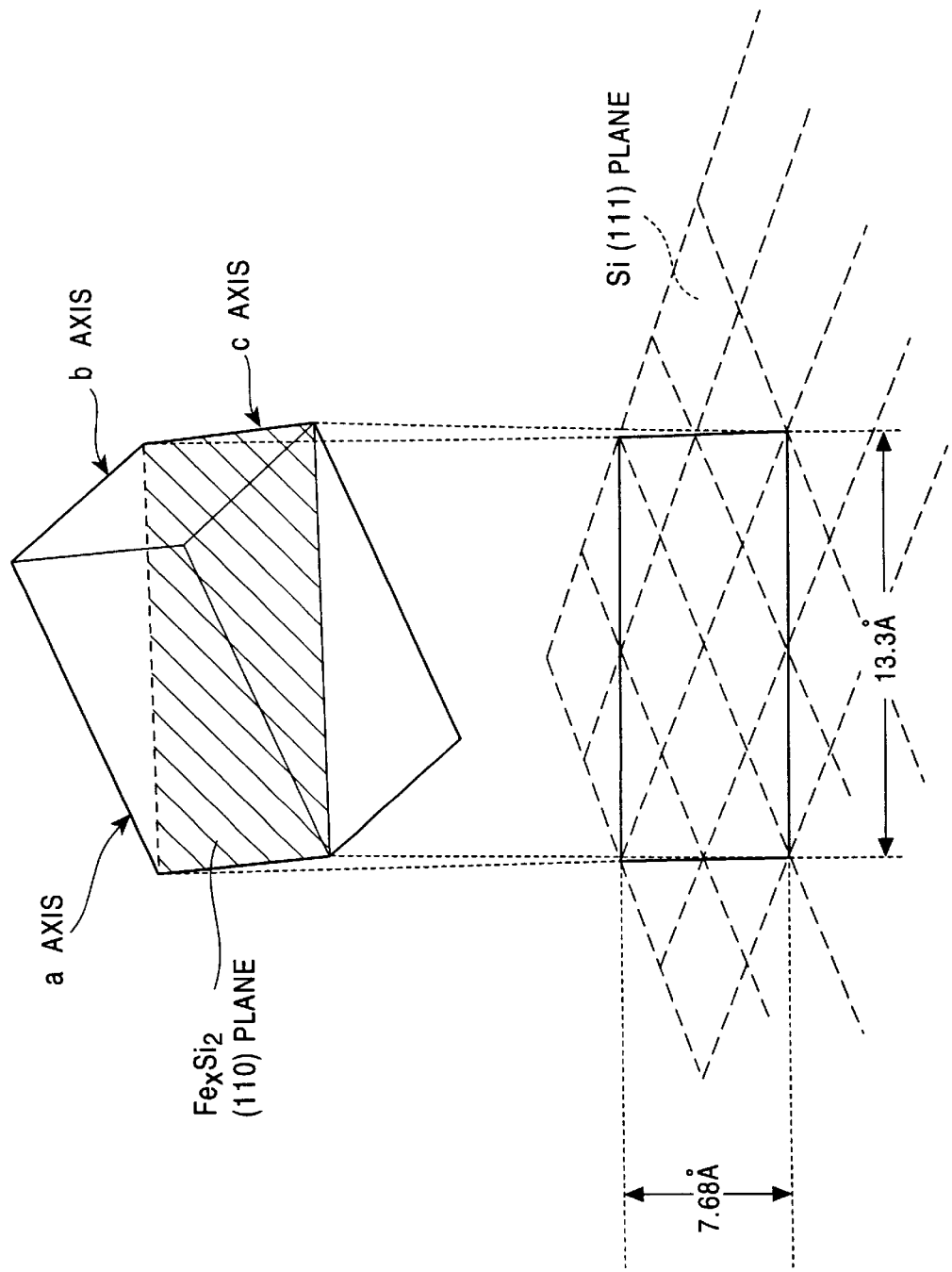
FIG. 1 is an illustration of the state of heteroepitaxial relationship between $Fe_xSi_2$ having a β'-I structure and monocrystalline silicon according to a first embodiment of the present invention.
Figure 2:
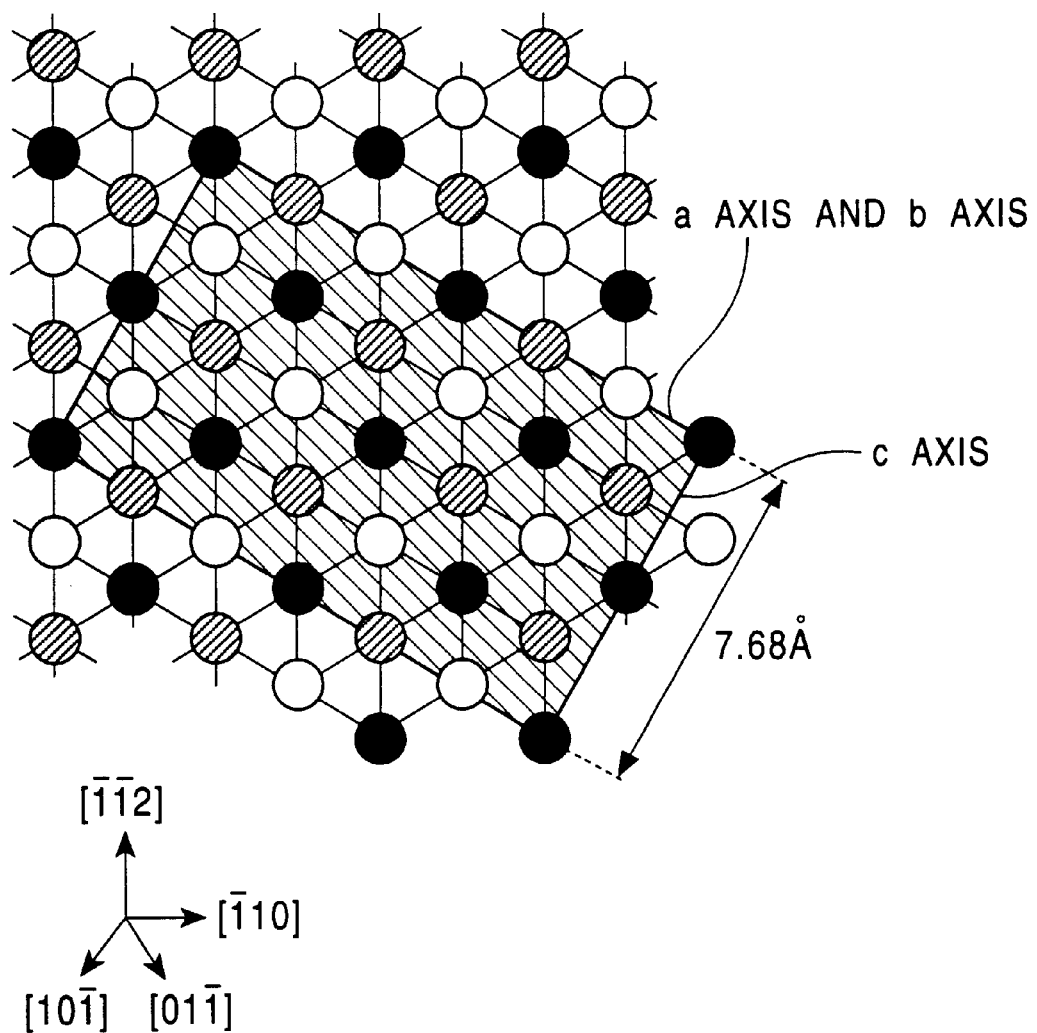
FIG. 2 illustrates the atomic arrangement of a crystalline silicon and the heteroepitaxial interface between $Fe_xSi_2$ having a β'-I structure and monocrystalline silicon viewed from the crystal direction [111] in FIG. 1.

In FIGS. 1 and 2, the portion marked by slanted lines indicates a heteroepitaxial interface of Fe$_x$Si$_2$ of the present invention. In other words, Fe$_x$Si$_2$ is joined to the silicon layer at the portion marked by the slanted lines in FIG. 2 when viewed from the crystal direction [111] of the silicon layer in terms of atomic arrangement. In FIG. 2, atoms represented by different symbols indicate silicon atoms on different atomic net planes orthogonal to the each direction. Black dots represent silicon atoms on each plane. The {110} plane of Fe$_x$Si$_2$ is joined to the {111} plane of the crystalline silicon. The crystalline structure of the Fe$_x$Si$_2$ belongs to the P2$_1$/c space group and has lattice constants of: a axis=10.17±0.35 Å, b axis=7.75±0.35 Å, and c axis=7.68±0.20 Å. The angle formed by a axis and b axis is 95±3°.

Figure 3:
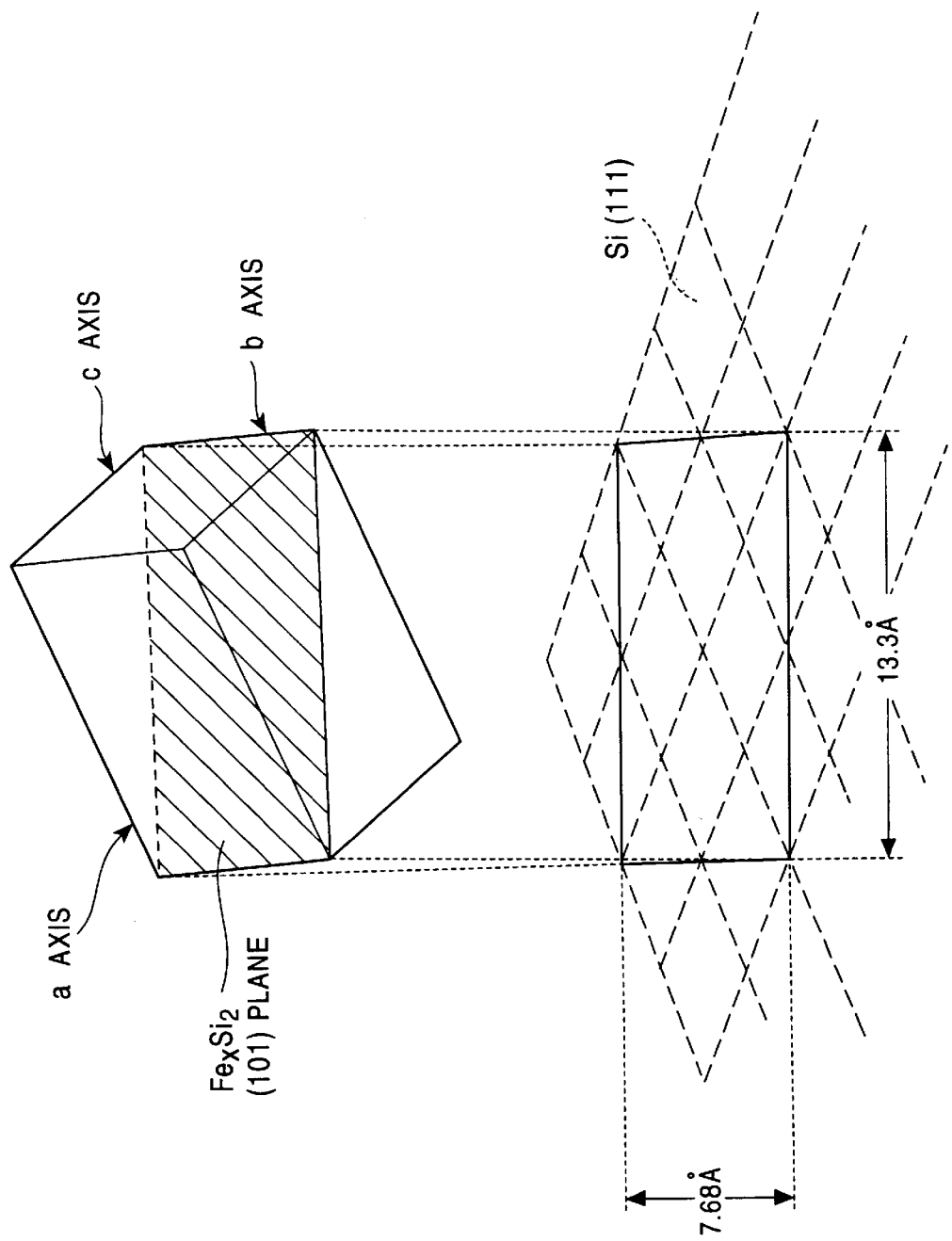
FIG. 3 is an illustration of the state of heteroepitaxial relationship between $Fe_xSi_2$ having a β'-II structure and monocrystalline silicon according to the first embodiment of the present invention.
Figure 4:
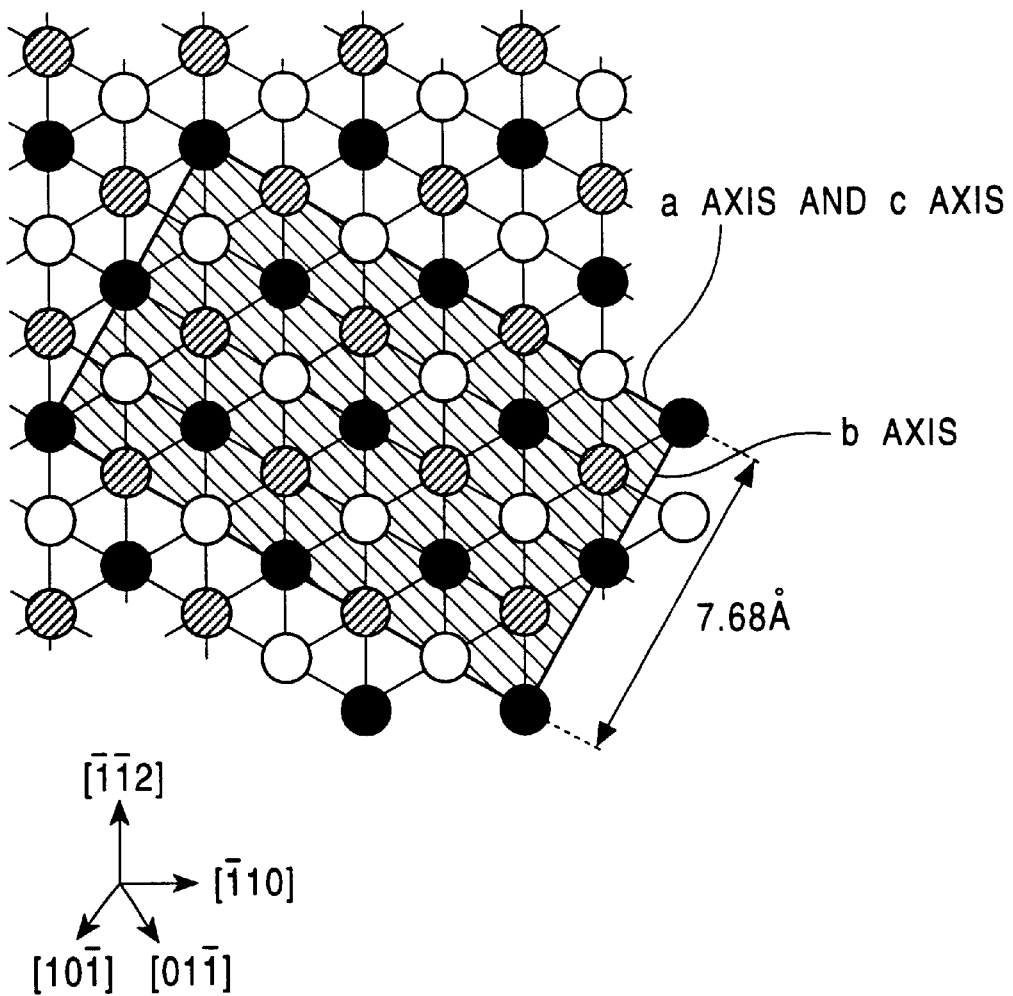
FIG. 4 illustrates the atomic arrangement of a crystalline silicon and the heteroepitaxial interface between $Fe_xSi_2$ having a β'-II structure and monocrystalline silicon viewed from the crystal direction [111] in FIG. 3.

As shown in FIGS. 3 and 4, the lattice constant 7.79 Å of the b axis is affected by the interatomic distance 7.68 Å of the {111} crystal plane of the silicon. Thus, the crystal of $\beta$-FeSi$_2$ is deformed and the $\beta$-FeSi$_2$, originally orthorhombic, changes to a monoclinic crystal. The Fe$_x$Si$_2$ is joined to the {111} plane of the crystalline silicon at the {101} plane thereof and has a crystal structure belonging to the C2/c space group. The lattice constants thereof are: a axis=10.14±0.35 Å, b axis=7.68±0.20 Å, and c axis=7.76±0.35 Å. The angle formed by a axis and c axis is 95±3°.

When the $\beta$-FeSi$_2$ is formed on the {111} plane of the crystalline silicon, either one of $\beta$'-I and $\beta$'-II is formed. Although the lattice constants of the b axis and the c axis of $\beta$-FeSi$_2$ differ from one another, they do not differ much from each other in terms of energy level. The optical material of the present invention may comprise a layer having both $\beta$'-I and $\beta$'-II.

It should be noted here that because the lattice constant of the a axis of the $\beta$-FeSi$_2$ is 9.80 Å and is significantly larger than those of the b axis and c axis, the crystal would be distorted significantly when joined to the interatomic distance 7.68 Å of the {111} plane of the crystalline silicon, resulting in dislocations. Accordingly, the Fe$_x$Si$_2$ will not be epitaxially joined to the {111} plane of the crystalline silicon at the {011} plane thereof.

Figure 5:
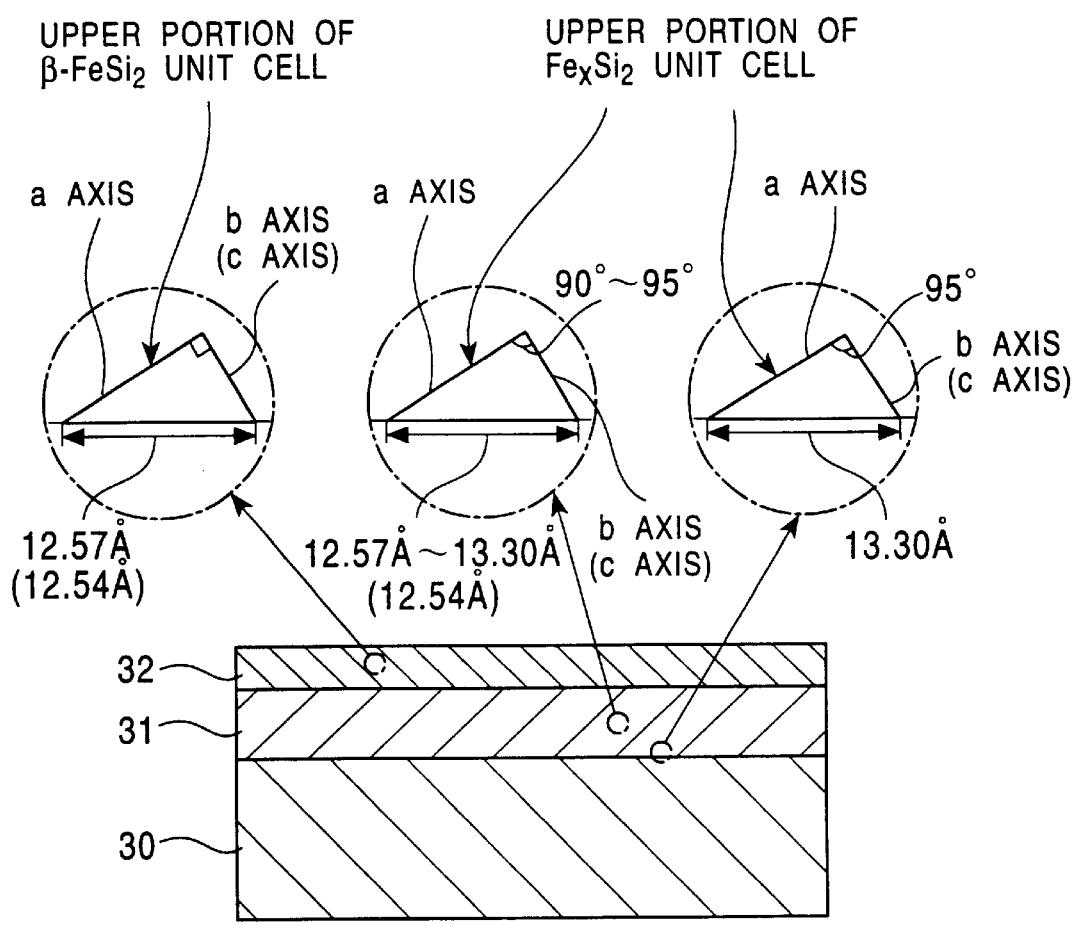
FIG. 5 illustrates the state of heteroepitaxial relationship between β-$FeSi_2$, $Fe_xSi_2$ having a β'-I or β'-II structure, and monocrystalline silicon grown by an epitaxial method according to a second embodiment of the present invention.

Next, a second embodiment of the present invention will be described referring to FIG. 5.

In this embodiment, the optical material includes Fe$_x$Si$_2$ 31 having a $\beta$'-I structure or a $\beta$'-II structure of monoclinic crystalline structure and $\beta$-FeSi$_2$ 32 having an orthorhombic structure. The total thickness of Fe$_x$Si$_2$ 31 having the $\beta$'-I structure or $\beta$'-II structure and the $\beta$-FeSi$_2$ 32 is 200 to 10,000 Å.

When the Fe$_x$Si$_2$ 31 having the $\beta$'-I structure or $\beta$'-II structure in which the angle formed by the a axis and b axis or c axis, respectively, is 95±3° is formed on a {111} plane 30 of crystalline silicon and the thickness thereof is gradually increased, effects of stress applied from the {111} plane 30 are gradually reduced and the angle formed by the a axis and b axis or c axis, respectively, of the Fe$_x$Si$_2$ 31 gradually approaches 90°, which is a stable angle. After the thickness reaches the limit, FeSi$_2$ is formed without being affected by the stress from the {111} plane 30 of crystalline silicon and the $\beta$-FeSi$_2$ 32, in which the a axis and b axis or c axis, respectively, form an angle of 90°, is formed. In this embodiment, the total thickness of the Fe$_x$Si$_2$ 31 having the $\beta$'-I structure or the $\beta$'-II structure and the $\beta$-FeSi$_2$ 32 is 200 to 10,000 Å. The optical material of this second embodiment has a smaller emission intensity and reduced photo-receiving performance per unit volume compared to the optical material of the first embodiment; however, the thickness of the layer may be increased to improve the overall emission intensity and photo-receiving performance.

As a method for forming Fe$_x$Si$_2$ on the surface of crystalline silicon, a method such as a reactive deposition epitaxy (RDE) method, a pulsed laser deposition (PLD) method, a molecular beam epitaxy (MBE) method, a sputtering method, a chemical vapor deposition (CVD) method, a chemical beam epitaxy (CBE) method, a solid phase epitaxy (SPE) method, an electron beam evaporation method, etc., can be employed.

As a method for forming Fe$_x$Si$_2$ in the interior of the crystalline silicon, implantation of Fe ions in the crystalline silicon or an epitaxial growth technique in which Fe$_x$Si$_2$ is first epitaxially grown on the surface of the crystalline silicon and then silicon is further epitaxially grown on Fe$_x$Si$_2$ can be employed.

When the epitaxial growth technique is employed, Fe$_x$Si$_2$ is formed by depositing Fe$_x$Si$_2$ on a silicon substrate which has the {111} plane of crystalline silicon at the surface thereof. When a silicon substrate having a plane orientation other than {111}, such as {001}, is used, the surface thereof is etched in advance so as to expose the {111} plane and then Fe$_x$Si$_2$ is deposited to fabricate the optical material of the present invention. Also when the epitaxial growth technique is employed to form Fe$_x$Si$_2$, by controlling the layer thickness so as to yield a crystal layer in conformity with the {111} plane at the surface of the silicon, monoclinic crystals can be obtained. When the layer is thick, the structure shown in FIG. 5 is obtained. When the thickness of the layer is further increased so as to exceed the limit of the monoclinic crystals, the overall layer will be β-FeSi$_2$.

Figure 6:
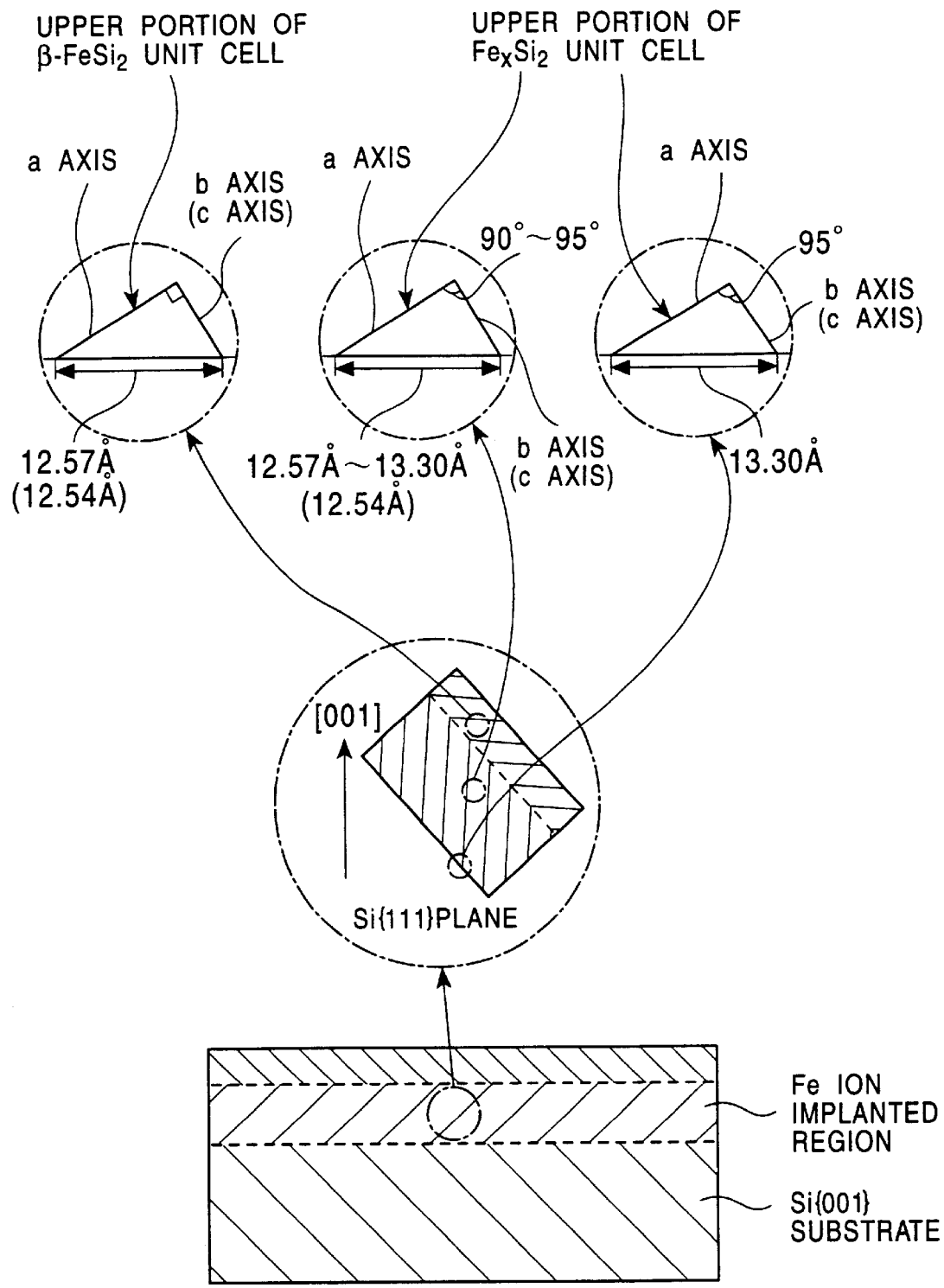
FIG. 6 illustrates a state of heteroepitaxial relationship between β-$FeSi_2$, $Fe_xSi_2$ having a β'-I or β'-II structure, and monocrystalline silicon when Fe ions are implanted to a {001} oriented silicon substrate.

When an ion implantation method is employed to form Fe$_x$Si$_2$, no restriction is imposed regarding the ion beams and plane orientation of the crystalline silicon. The optical material of the present invention may be fabricated by implanting ions in the silicon substrate having a {001} oriented surface. Preferably, when the ion implantation is performed, the amount of Fe ions may be controlled so as to form a number of small crystals epitaxially joined to the {111} plane of crystalline silicon in the interior of the crystalline silicon. In this manner, monoclinic crystals are formed. When the amount of ions is increased, the structure shown in FIG. 6 is obtained in the interior of the silicon substrate. When the amount of ions is further increased, the size of the crystals is increased and the entire crystal may change to an orthorhombic crystal which is the original crystalline structure of β-FeSi$_2$.

Figure 9:
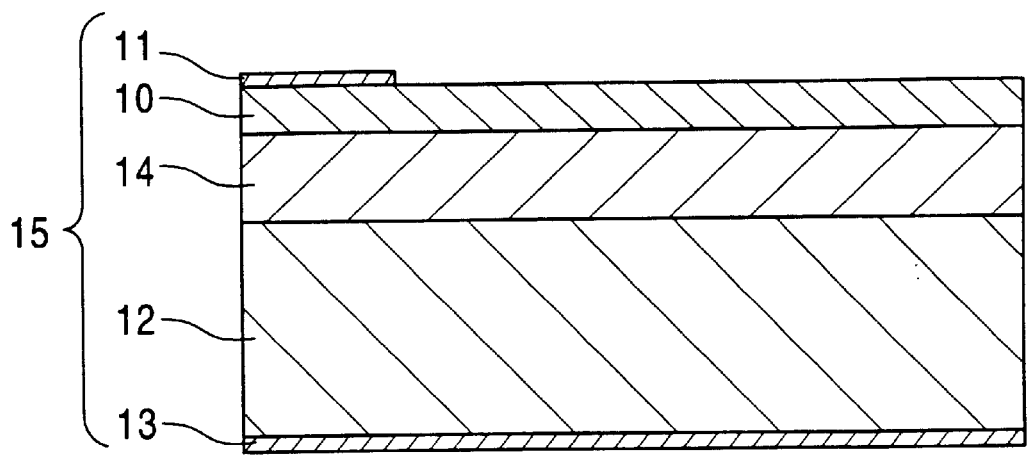
FIG. 9 is a schematic cross-sectional view illustrating the structure of an optical material.

In order to manufacture an optical element by using the thus obtained optical material, a vacuum evaporator (not shown in the drawing) is used to form an electrode 11 comprising, for example, an Al thin-film on the upper surface of a p-type or n-type silicon layer 10 so as to expose part of the p-type or n-type silicon layer 10 (see FIG. 9). Then, an electrode 13 comprising, for example, an Au—Sb alloy layer is formed on the lower surface of an n-type or p-type silicon substrate 12. Thus, an optical element 15 having an Fe$_x$Si$_2$ layer 14 in the interior thereof can be manufactured. It should be noted that no significant changes in light-emitting/light-absorbing characteristics of the optical material is observed even when Mn or Al is added to form a p-type semiconductor or when Co is added to form an n-type semiconductor so as to control conductivity.

Figure 10:
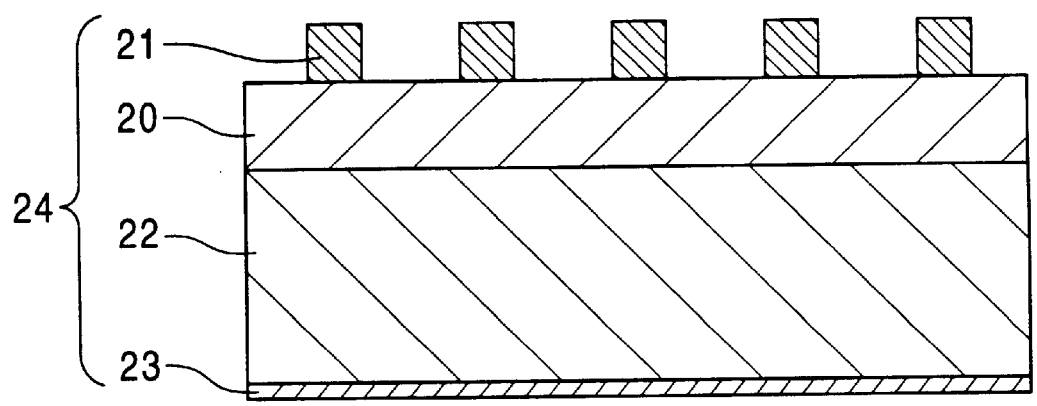
FIG. 10 is a schematic cross-sectional view illustrating the structure of a solar-cell element using the optical material.
Figure 11:
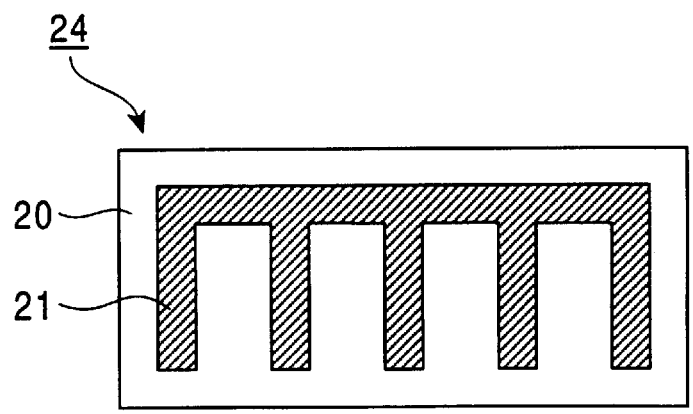
FIG. 11 is a plan view of the solar-cell element shown in FIG. 10.

A solar cell element can also be produced by using the optical material of the present invention. An Fe$_x$Si$_2$ layer of β'-I or β'-II structure is formed on the surface of the crystalline silicon. Then, by using a vacuum evaporator (not shown), a comb-shaped electrode 21 comprising an Al thin-film is formed on the upper surface of an Fe$_x$Si$_2$ layer 20, as shown in FIGS. 10 and 11, and an electrode 23 comprising an Au—Sb alloy layer is formed on the lower surface of an n-type silicon substrate 22 so as to manufacture a solar cell element 24. Since this solar cell element uses monoclinic Fe$_x$Si$_2$ crystals in the active layer thereof, the absorption coefficient of the monoclinic Fe$_x$Si$_2$ in the vicinity of the band edge is greater than that of β-FeSi$_2$, and a solar cell with improved efficiency can be manufactured. In the solar cell element, furthermore, since the crystalline structure of monoclinic Fe$_x$Si$_2$ used in the active layer is deformed, the effective mass of the carriers is reduced, and the resistance inside the element is decreased. Consequently, the solar cell element has less internal loss and effective conversion efficiency is increased.

EXAMPLES

Next, examples of the present invention are described with reference to the drawings.

Example 1

A {111} oriented silicon substrate washed by standard cleaning solution-1 (SC-1) is prepared. The substrate is heated to 650° C. and Fe is deposited on the surface of the substrate by a vacuum evaporator so as to epitaxially grow Fe$_x$Si$_2$ 300 Å in thickness on the surface of the substrate and to obtain the optical material. High purity Fe having a purity of 99.999% and high purity monocrystalline Si having a purity of 99.9999% are used as the raw materials. The resulting optical material is subjected to X-ray photoelectron spectrometry and x is found to be 1.0.

Figure 7:
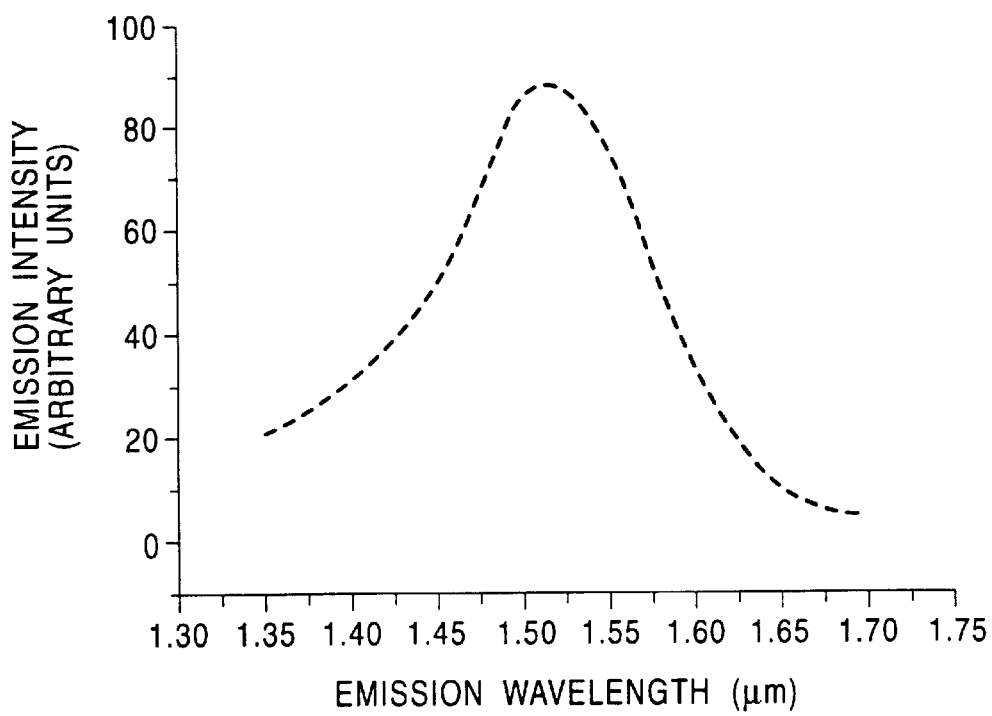
FIG. 7 is a graph showing emission wavelength and emission intensity of a light emitting material.
Figure 8:
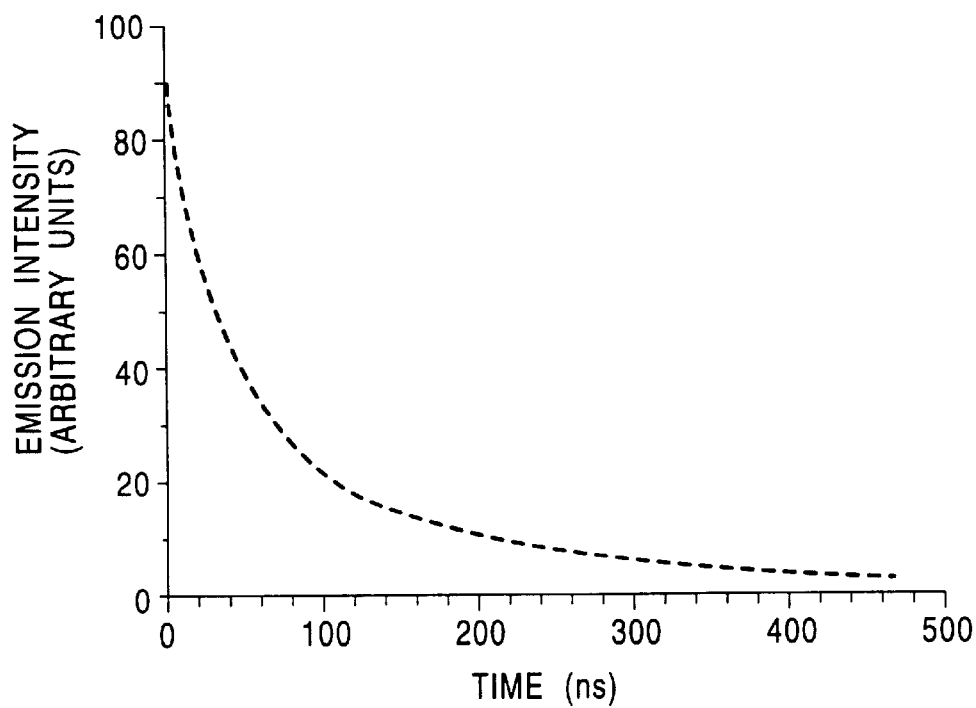
FIG. 8 is a graph showing emission intensity and luminescent decay time of the light emitting material.

Photoluminescence of the resulting optical material is examined at room temperature. The results are shown in FIG. 7. FIG. 8 shows the relationship between emission intensity and time. As is apparent from FIG. 7, photoluminescence having a peak wavelength of approximately 1.5 μm is observed at room temperature. Also, as is apparent from FIG. 8, luminescent decay time is several ten nanoseconds or less. It should be noted that the luminous decay life time is the time required for the luminous intensity to decrease to half the peak intensity. Then, the crystalline structure of Fe$_x$Si$_2$ formed on the surface of the substrate is examined by using an X-ray diffraction device. The results show that the Fe$_x$Si$_2$ layer has both β'-I and β'-II structures of monoclinic crystals, a structure different from that of the conventional β-FeSi$_2$.

Example 2

An n-type silicon substrate having a (111) oriented surface and including impurities at $5 \times 10^{18}$ cm$^{-3}$ is prepared. As in Example 1, Fe$_x$Si$_2$ is epitaxially grown to 300 Å in thickness on the surface of the silicon substrate by using the same vacuum evaporator as in Example 1. The substrate is heated to 650° C. and a p-type silicon layer having a dopant concentration of $1 \times 10^{17}$ cm$^{-3}$ and a thickness of 200 Å is deposited by using CVD device so as to cover the Fe$_x$Si$_2$ on the surface of the substrate and to fabricate the optical material. In this example, SiH$_4$ gas used as the source material gas and B$_2$H$_6$ gas used as the dopant are introduced into the CVD chamber. After the optical material is made, an electrode comprising an Al thin-film is formed on the upper surface of the top p-type silicon layer by using a vacuum evaporator (not shown) so as to expose part of the p-type silicon layer. An electrode comprising Au—Sb alloy layer is formed on the lower surface of the silicon substrate in the same manner. Thus, the optical element shown in FIG. 9 is obtained.

Forward bias is applied to the Al electrode and Au—Sb electrode of the resulting optical element so as to determine the electroluminescence thereof. The electroluminescence having a peak wavelength of approximately 1.5 μm, a wavelength which corresponds to the low-loss wavelength of silica glass optical fiber, is observed, as in Example 1. The luminescence decay time is substantially the same as that of Example 1.

Example 3

An n-type silicon substrate having a (111) oriented surface and containing a dopant at a concentration of $5 \times 10^{18}$ cm$^{-3}$ is prepared. Using the same vacuum evaporator as in Example 1, Fe is deposited on the surface of the substrate heated to 650° C. and is epitaxially grown until the thickness of the Fe$_x$Si$_2$ is 1,000 Å so as to form the optical material. Then a comb-shaped electrode comprising an Al thin-film is formed on the upper surface of the Fe$_x$Si$_2$ layer of the resulting material by the vacuum evaporator so as to expose part of the Fe$_x$Si$_2$ layer, and an electrode comprising Au—Sb alloy film is formed on the lower surface of the silicon substrate so as to form the optical element shown in FIGS. 10 and 11.

Comparative Example 1

An n-type silicon substrate having a (001) oriented surface and containing a dopant at a concentration of $5 \times 10^{18}$ cm$^{-3}$ is prepared. By using the same vacuum evaporator, Fe is deposited on the surface of the substrate heated to 650° so as to epitaxially grow β-FeSi$_2$ having a thickness of 1,000 Å and to make the optical material. Then, the resulting optical material is provided with a comb-shaped electrode comprising an Al thin-film and an electrode comprising Au—Sb alloy film, as in Example 3, so as to make a solar cell element.

Evaluation

Each of the solar cells obtained in Example 3 and Comparative Example 1 has a photo-receiving area of 0.1 cm$^2$ and has the comb-shaped electrode occupying 10% of the surface area. The relationship between photocurrent I and output voltage V relative to an air mass (AM) of 1.0 is examined. The effective conversion efficiency is shown in Table 1.

It should be noted that AM is a parameter for solar cell performance evaluation. An AM of 1.0 is a solar energy spectrum at sea level, under clear skies, and under the sun at its zenith.

TABLE 1

|  | Incident Energy (mW/cm$^2$) | Open-circuit Voltage (V) | Short-circuit Current Density (mA/cm$^2$) | Maximum Output (mW/cm$^2$) | Conversion Efficiency (%) |
| --- | --- | --- | --- | --- | --- |
| Example 3 | 98 | 0.6 | 28.8 | 13.1 | 14.9 |
| Comparative Example 1 | 98 | 0.6 | 27.5 | 12.4 | 14.1 |

As is apparent from Table 1, Example 3 using the optical material of the present invention is superior to the photo-receiving layer of Comparative Example 1 comprising β-FeSi$_2$ in short-circuit current density, maximum output, and conversion efficiency.

This application claims priority under 35 U.S.C. §119 to Japanese Patent Application Nos. 2000-83,519 (filed on Mar. 24, 2000), 2000-158,135 (filed on May 29, 2000), and 2000-249,281 (filed on Aug. 21, 2000), of which the entirety is incorporated by references herein.

What is claimed is:

1. An optical material comprising:
   crystalline silicon having an interior and a surface; and
   Fe$_x$Si$_2$ in the interior of the crystalline silicon or on the surface of the crystalline silicon, wherein
   the Fe$_x$Si$_2$ is in a form selected from the group consisting of dots, islands, and a film;
   the Fe$_x$Si$_2$ has a symmetrical monoclinic crystalline structure belonging to the P2$_1$/c space group and corresponding to a deformed structure of β-FeSi$_2$ generated by heteroepitaxial stress between the {110} plane of the Fe$_x$Si$_2$ and the {111} plane of the crystalline silicon;
   the Fe$_x$Si$_2$ has a thickness in a range of from 5 to 2,000 Å; and $0.85 \leq x \leq 1.1$.

2. An optical material according to claim 1, wherein the lattice constant of the c axis of the Fe$_x$Si$_2$ having the monoclinic crystalline structure is 7.68±0.20 Å, which is equal to the interatomic distance of the {111} plane of the crystalline silicon, the lattice constant of the a axis of the Fe$_x$Si$_2$ is 10.17±0.35 Å, the lattice constant of the b axis of the Fe$_x$Si$_2$ is 7.75±0.35 Å, and the angle defined by the a axis and the b axis of the Fe$_x$Si$_2$ is 95±3°.

3. An optical material according to claim 1, further comprising β-FeSi$_2$ having an orthorhombic crystalline structure directly on the Fe$_x$Si$_2$, wherein the total thickness of the Fe$_x$Si$_2$ and the β-FeSi$_2$ is 200 to 10,000 Å.

4. An optical element comprising at least one of a light-emitting layer and a photo-receiving layer, wherein the light-emitting layer and the photo-receiving layer each comprises the optical material of claim 1 in which the crystalline silicon is one of p-type and n-type.

5. An optical material comprising:
   crystalline silicon having an interior and a surface; and
   Fe$_x$Si$_2$ in the interior of the crystalline silicon or on the surface of the crystalline silicon, wherein
   the Fe$_x$Si$_2$ is in a form selected from the group consisting of dots, islands, and a film;
   the Fe$_x$Si$_2$ has a symmetrical monoclinic crystalline structure belonging to the C2/c space group and corresponding to a deformed structure of β-FeSi$_2$ generated by heteroepitaxial stress between the {101} plane of the Fe$_x$Si$_2$ and the {111} plane of the crystalline silicon;
   the Fe$_x$Si$_2$ has a thickness in a range of from 5 to 2,000 Å; and $0.85 \leq x \leq 1.1$.

6. An optical material according to claim 5, wherein the lattice constant of the b axis of the Fe$_x$Si$_2$ having a monoclinic crystalline structure is 7.68±0.20 Å, which is equal to the interatomic distance of the {111} plane of the crystalline silicon, the lattice constant of the a axis of the Fe$_x$Si$_2$ is 10.14±0.35 Å, the lattice constant of the c axis of the Fe$_x$Si$_2$ is 7.76±0.35 Å, and the angle formed by the a axis and the c axis of the Fe$_x$Si$_2$ is 95±3°.

7. An optical material according to claim 5, further comprising β-FeSi$_2$ having an orthorhombic crystalline structure directly on the Fe$_x$Si$_2$, wherein the total thickness of the Fe$_x$Si$_2$ and the βFeSi$_2$ is 200 to 10,000 Å.

8. An optical element comprising at least one of a light-emitting layer and a photo-receiving layer, wherein the light-emitting layer and the photo-receiving layer each comprises the optical material of claim 5 in which the crystalline silicon is one of p-type and n-type.

9. A method of making an optical material, the method comprising
   synthesizing Fe$_x$Si$_2$ at a surface or in an interior of crystalline Si; and
   producing the optical material of claim 1.

10. The method according to claim 9, wherein the Fe$_x$Si$_2$ is synthesized at the surface of the crystalline silicon by a process selected from the group consisting of reactive deposition epitaxy, pulsed laser deposition, molecular beam epitaxy, sputtering, chemical vapor deposition, chemical beam epitaxy, solid phase epitaxy and electron beam evaporation.

11. The method according to claim 9, wherein the Fe$_x$Si$_2$ is synthesized in the interior of the crystalline silicon by an ion implantation process.

12. A method of making an optical material, the method comprising
   synthesizing Fe$_x$Si$_2$ at a surface or in an interior of crystalline Si; and
   producing the optical material of claim 5.

13. The method according to claim 12, wherein the Fe$_x$Si$_2$ is synthesized at the surface of the crystalline silicon by a process selected from the group consisting of reactive deposition epitaxy, pulsed laser deposition, molecular beam epitaxy, sputtering, chemical vapor deposition, chemical beam epitaxy, solid phase epitaxy and electron beam evaporation.

14. The method according to claim 12, wherein the Fe$_x$Si$_2$ is synthesized in the interior of the crystalline silicon by an ion implantation process.

* * * * *